(12) United States Patent
Hu

(10) Patent No.: US 11,606,008 B2
(45) Date of Patent: Mar. 14, 2023

(54) EMI FILTER FOR DC MOTOR

(71) Applicant: Johnson Electric International AG, Murten (CH)

(72) Inventor: Bo Hu, Shenzhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 0 days.

(21) Appl. No.: 17/378,598

(22) Filed: Jul. 16, 2021

(65) Prior Publication Data

US 2021/0344257 A1 Nov. 4, 2021

Related U.S. Application Data

(63) Continuation of application No. PCT/CN2019/072199, filed on Jan. 17, 2019.

(51) Int. Cl.
| | | |
|---|---|---|
| *H02K 11/026* | (2016.01) | |
| *H02K 5/14* | (2006.01) | |
| *H05K 1/02* | (2006.01) | |
| *H05K 1/18* | (2006.01) | |
| *H02K 11/02* | (2016.01) | |
| *H01F 27/30* | (2006.01) | |
| *H02H 9/04* | (2006.01) | |
| *H04B 15/02* | (2006.01) | |

(52) U.S. Cl.
CPC ......... *H02K 11/026* (2013.01); *H01F 27/306* (2013.01); *H02H 9/041* (2013.01); *H02K 5/143* (2013.01); *H02K 11/02* (2013.01); *H04B 15/02* (2013.01); *H05K 1/02* (2013.01); *H05K 1/18* (2013.01)

(58) Field of Classification Search
CPC ...... H02K 11/026; H02K 5/143; H02K 11/02; H01F 27/306; H02H 9/041; H04B 15/02; H05K 1/02; H05K 1/18
USPC ........................................................ 361/118
See application file for complete search history.

(56) References Cited

U.S. PATENT DOCUMENTS

| | | | |
|---|---|---|---|
| 5,313,126 A | 5/1994 | Forsythe | |
| 2003/0048029 A1 | 3/2003 | DeDaran et al. | |
| 2011/0018377 A1* | 1/2011 | Zhao | ..... H02K 11/024 |
| | | | 310/72 |

(Continued)

FOREIGN PATENT DOCUMENTS

| | | |
|---|---|---|
| CN | 101594028 A | 12/2009 |
| CN | 201947125 U | 8/2011 |
| CN | 203813608 U | 9/2014 |
| CN | 105337458 A | 2/2016 |

(Continued)

OTHER PUBLICATIONS

WO 2010/136240; Robert Bosch Gmbh; Dec. 2, 2010: Title: Interference filter for a direct current motor; abstract; specification, drawings (Year: 2010).*

(Continued)

*Primary Examiner* — Dharti H Patel
(74) *Attorney, Agent, or Firm* — Aird & McBurney LP

(57) ABSTRACT

An electromagnetic interference (EMI) filter 32 is provided which is suitable for a DC motor 10. The EMI filter 32 comprises an EMI suppression circuit 34 having first and second DC-motor-terminal inputs 36a, 36b, and an MW-band power choke 44 coupled to one of the first and second DC-motor-terminal inputs 36a, 36b to increase the motor inductance in the MW frequency band.

13 Claims, 6 Drawing Sheets

(56) References Cited

U.S. PATENT DOCUMENTS

| | | |
|---|---|---|
| 2013/0162370 A1 | 6/2013 | Lai et al. |
| 2013/0307380 A1 | 11/2013 | Zeng et al. |

FOREIGN PATENT DOCUMENTS

| | | |
|---|---|---|
| CN | 106464063 A | 2/2017 |
| CN | 107154708 A | 9/2017 |
| EP | 2847847 A2 | 4/2018 |
| JP | S56-145358 U | 3/1986 |
| JP | H 02-148804 A | 6/1990 |
| JP | H05-77921 U | 10/1993 |
| JP | 2003-530056 A | 10/2003 |
| JP | 2005-516568 A | 6/2005 |
| JP | 2013-243915 A | 12/2013 |
| KR | 2004-0072615 A | 8/2004 |
| KR | 2015-0003354 A | 1/2015 |

OTHER PUBLICATIONS

JP-H0541368; Title: Electric Motor; Jun. 1, 1993; Entire specification with drawings (Year: 1991).*

Notice of Reasons for Rejection from corresponding Japanese application No. 2021-541471 dated Feb. 2, 2022.

English Translation of Notice of Reasons for Rejection from corresponding Japanese application No. 2021-541471 dated Feb. 2, 2022.

English Translation of JP 2013-243915 from Google Patents dated Mar. 20, 2022.

English Translation of JP S56-145358 from Google Patents dated Mar. 20, 2022.

English Translation of JP 2005-516568 from Google Patents dated Mar. 20, 2022.

English Translation of JP H02-148804 from Google Patents dated Mar. 20, 2022.

Notice of Reasons for Rejection from corresponding Korean application No. 10-2021-7025866 dated Nov. 9, 2021.

English Translation of Notice of Reasons for Rejection from corresponding Korean application No. 10-2021-7025866 dated Nov. 9, 2021.

English Translation of KR 2015-0003354 from the European Patent Office dated Jan. 12, 2022.

English Translation of KR 2004-0072615 from the European Paten Office dated Jan. 12, 2022.

English Translation of CN203813608U from the European Patent Office dated Jan. 12, 2022.

English Translation of JP4919571B2 (which is the issued Patent from JP 2003-530056) from the European Patent Office dated Jan. 12, 2022.

International Search Report dated Oct. 9, 2019 and issued in connection with PCT/CN2019/072199.

European Search Report from corresponding EP Application No. 19910341.7 dated Jun. 23, 2022.

* cited by examiner

EMI FILTER FOR DC MOTOR

The present invention relates to an EMI filter for a DC motor, particularly for the limiting of motor emission in the MW frequency band. The invention further relates to a DC motor having such an EMI filter, to a valve actuator utilising said DC motor, and to a method of suppressing MW-frequency-band emission of a DC motor.

DC motor filters are traditionally realised with electromagnetic interference (EMI) chokes, grounding capacitors, and line capacitors, due to complicated end cap structure creating parasitic noise paths. The performance of such solutions is inadequate to meet Comité International Special des Perturbations Radioélectriques (CISPR) 25, class 5 requirements. This standard is an increasingly popular benchmark and requirement for body electronics, particularly in the automotive electronic market.

Some existing products meet the CISPR 25, class 5 criteria by the use of varistors to suppress noise at the source location. However, such solutions require large capacitors, typically in excess of 2 µF, and the devices do not work for transient current control. Transient current control applications typically have limited input capacitance requirements, usually being limited to a few hundred nF.

The present invention seeks to provide a DC motor that meets CISPR 25, class 5 criteria in the MW (0.52-1.8 MHz), FM (76-108 MHz), RKE (300-330 MHz, 420-450 MHz), DAB (174-241 MHz), and TV IV/V (420-450 MHz) frequency bands, whilst still being suitable for transient current control.

According to a first aspect of the invention, there is provided an electromagnetic interference (EMI) filter for a DC motor, the EMI filter comprising: an EMI suppression circuit having first and second DC-motor-terminal inputs; and an MW-band power choke coupled to one of the first and second DC-motor-terminal inputs to increase the motor inductance in the MW frequency band.

In order to meet the CISPR 25, class 5 criteria, the EMI of a DC motor must fall below certain predetermined thresholds. High frequency EMI has been addressed relatively easily to date; however, to suppress MW-band EMI, high input capacitance has been necessary. The present invention solves this issue by the provision of at least one MW-band power choke, allowing for a much lower input capacitance to be used, and therefore allowing the application of the filtered DC motor for transient current control.

Preferably, two said MW-band power chokes may be provided, respectively coupled to the first and second DC-motor-terminal inputs.

In a preferred embodiment, two MW-band power chokes are provided, which may improve the ease of tunability and/or EMI reduction compared with a single MW-band power choke.

Optionally, the MW-band power choke may be a tunable-inductance power choke.

A tunable-inductance power choke has the advantage of allowing the user to tune the inductance and therefore MW frequency band EMI suppression to within predetermined bands. By only tuning the inductance as required, there is less risk of consequential negative effects to the motor performance by using an inductor which is much too large.

In one preferable embodiment, the MW-band power choke may comprise a ferrite-core coil. The ferrite-core coil may comprise a coil winding around a MnZn ferrite rod.

A ferrite-core coil is a simple inductor which can be readily incorporated into the EMI filter, and an MnZn rod offers high performance EMI suppression within the MW frequency band for a given inductor size. This allows for a more compact filter to be produced.

Optionally, the MW-band power choke may comprise a surface-mounted device (SMD) power choke.

An SMD is more readily mounted to an associated circuit substrate, and therefore manufacture of the EMI filter may be simplified accordingly.

In one embodiment, the MW-band power choke may have an inductance of at least 25 µH, more preferably of at least 50 µH, and additionally or alternatively in the range of 25 to 125 µH, more preferably in a range of 50 to 100 µH. One indicative embodiment is provided having an inductance of 53 µH.

An inductance of this scale, and preferably tunable within this range, is ideal for MW frequency band suppression. However, it will be appreciated that motors of different characteristics may result in different optimum Preferably, the EMI suppression circuit may comprise a plurality of Y-capacitors and a plurality of shunt resistors.

An EMI suppression circuit having such a structure is a simple and effective means of suppressing high frequency EMI in a cost-effective manner.

According to a second aspect of the invention, there is provided a DC motor comprising first and second motor terminals, and an EMI filter in accordance with the first aspect of the invention, the first and second DC-motor-terminal inputs being connected to the first and second motor terminals.

A DC motor having such an EMI filter can be made to meet the necessary CISPR criteria, whilst also being suitable for transient current control, given the much lower input capacitance requirements than for traditional MW-band EMI filters.

The DC motor may optionally comprise a motor power choke coupled between the first DC-motor-terminal input and the first motor terminal, and a motor power choke coupled between the second DC-motor-terminal and the second motor terminal.

Such a configuration provides an improved EMI suppression for the motor, which may reduce the need for the EMI filter to be large or have complicated circuitry.

Furthermore, there may be provided a varistor connected to a commutator of the DC motor, each of the first and second motor terminals being in brushed communication with the commutator.

A varistor may further offer surge protection, and may therefore have a consequential improved effect on the EMI suppression for the DC motor.

According to a third aspect of the invention, there is provided a valve actuator comprising a DC motor in accordance with the second aspect of the invention.

A valve actuator using such a DC motor is likely to meet the necessary CISPR criteria which are becoming increasingly required as automotive industry standard.

According to a fourth aspect of the invention, there is provided a method of suppressing MW-frequency-band emission of a DC motor, the method comprising the steps of: a] attaching an EMI suppression circuit having first and second DC-motor-terminal inputs to first and second motor terminals of the DC motor; b] coupling an MW-band power choke to one of the first and second DC-motor-terminal inputs of the EMI suppression circuit; and c] tuning an inductance of the MW-band power choke until a predetermined MW-frequency-band emission criterion of the DC motor is met.

A tunable EMI filter allows the EMI in the MW frequency band to be suppressed only as much as is required. This may allow the DC motor to be used in specific applications which specify the compliance with predetermined criteria, without significantly impeded motor performance.

Preferably, the predetermined MW-frequency-band emission criterion may be a CISPR 25, class 5 criterion in the MW frequency band.

By tuning the filter to meet these criteria, it becomes much more straightforward to create a device suitable for inclusion in an automotive application.

The invention will now be more particularly described, by way of example only, with reference to the accompanying drawings, in which.

Figure 1:
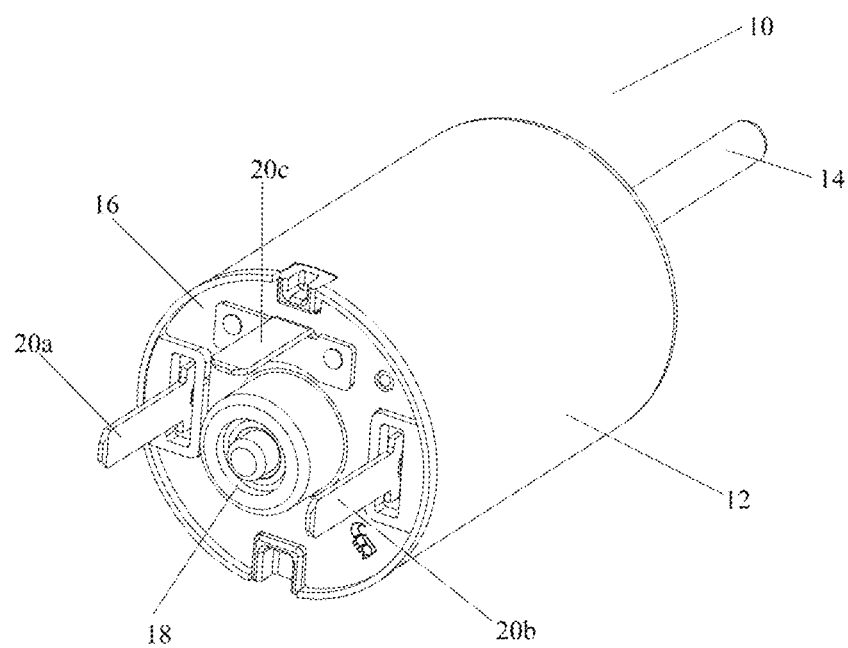
FIG. 1 shows a perspective representation of one embodiment of a DC motor in accordance with the state of the art, suitable for use with the present invention.

Referring to FIG. 1, there is indicated a DC motor referenced globally at 10, in accordance with the state of the art. The DC motor 10 comprises a motor housing 12 which encloses a stator and a rotor, and an output shaft 14 extends out of the motor housing 12 so as to be communicable with the rotor, thereby allowing drive to be imparted from the DC motor 10.

An end cap 16 is provided which seals one end of the motor housing 12, and which may have a shaft-receiving aperture 18 therein to allow the output shaft 14 to extend therethrough, or indeed to act as a bearing for the output shaft 14.

The DC motor 10 has first and second motor terminals 20a, 20b which permit electrical connections to be made to the internal components thereof, and these first and second motor terminals 20a, 20b are here provided as a pair of stabs which extend through the end cap 16 so as to reveal exposed conductive surfaces. A grounding pin 20c is also provided on the end cap 16 which is electrically isolated from the first and second motor terminals 20a, 20b.

Figure 2:
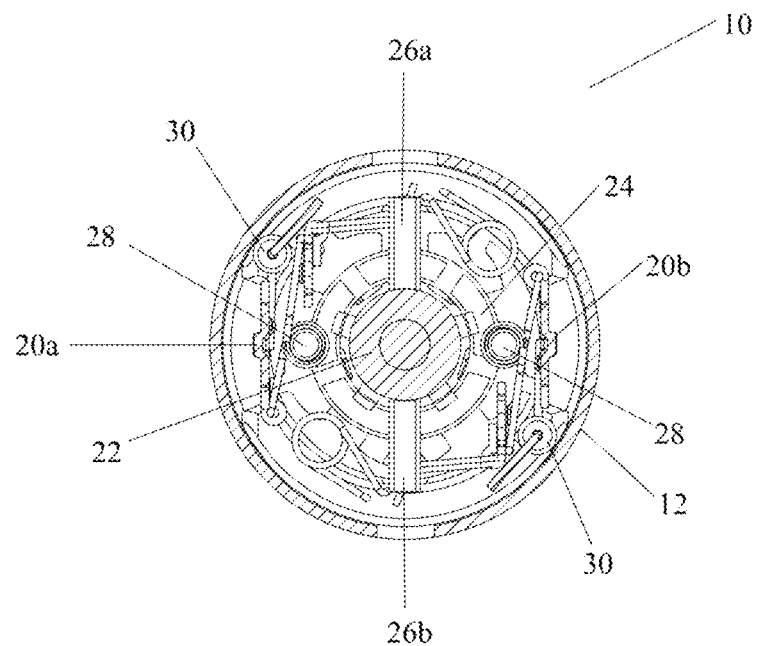
FIG. 2 shows a cross-section through the DC motor of FIG. 1.

FIG. 2 shows the electrical connections inside the motor housing 12. The rotor is connected to a commutator 22, which is preferably also connected to a varistor, more preferably a ring varistor 24. Such a varistor may reduce noise generated by surge voltages as the commutator 22 rotates with respect to brushes 26a, 26b of the DC motor 10.

First and second brushes 26a, 26b may then also be provided which couple the first and second motor terminals 20a, 20b to the commutator 22 respectively. As an initial means of EMI suppression, it is preferred that a motor power choke 28 and a grounding capacitor 30 be positioned between the first motor terminal 20a and brush 26a and the second motor terminal 20b and brush 26b. Preferably, the motor power choke 28 is provided as a ferrite-core coil, with the grounding capacitor 30 preferably being provided as a Y-capacitor.

Figure 3:
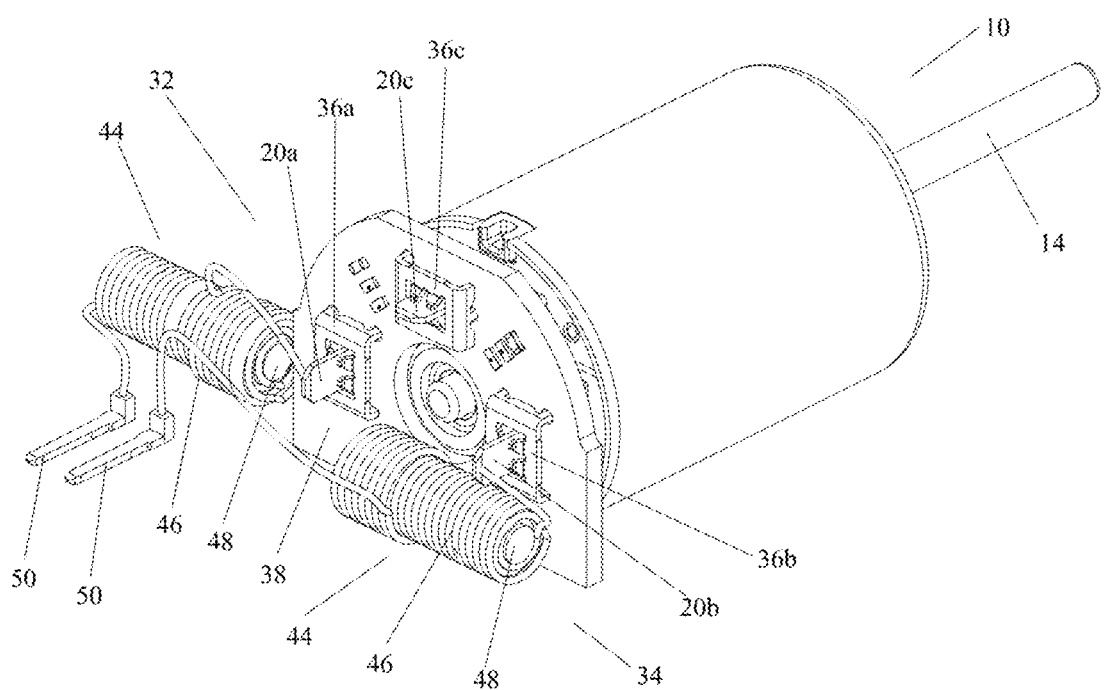
FIG. 3 shows a perspective representation of the DC motor of FIG. 1 having a first embodiment of an EMI filter in accordance with the first aspect of the invention.

FIG. 3 shows the EMI filter 32 of the present invention. There is an EMI suppression circuit 34 which has first and second DC-motor-terminal inputs 36a, 36b which are respectively engagable with the first and second DC motor terminals 20a, 20b. Here, the first and second DC-motor-terminal inputs 36a, 36b are formed as sprung jaws in a conductive element which extends through a circuit substrate 38, preferably a printed circuit board, of the EMI suppression circuit 34. A corresponding grounding-pin input 36c is also provided, which may serve to improve the ease of mounting or stability of the EMI suppression circuit 34 onto the end cap 16 of the DC motor 10.

The circuit substrate 38 preferably includes a receiving aperture therethrough via which the output shaft 14 of the DC motor 10 may extend, if required.

Figure 4:
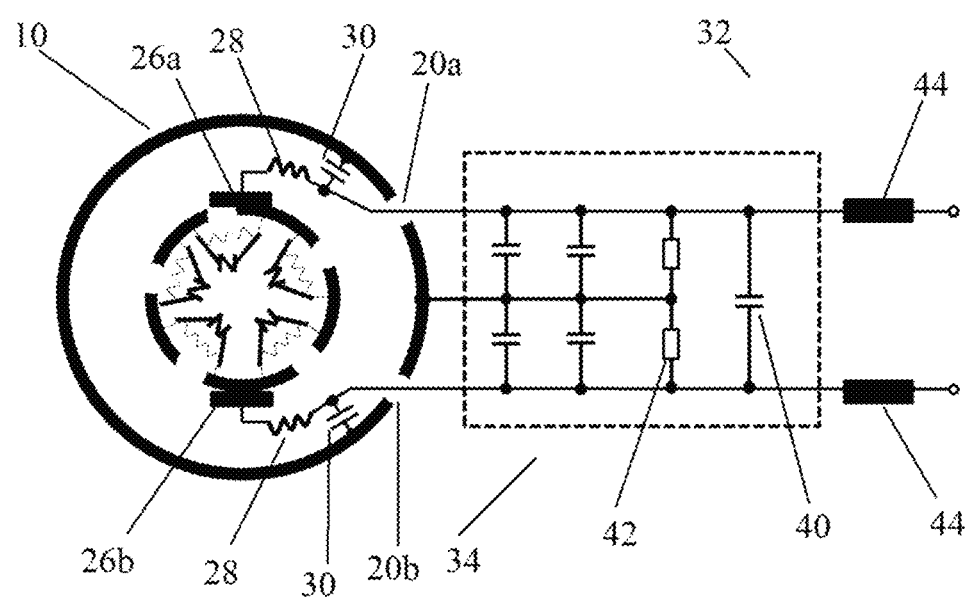
FIG. 4 shows an indicative circuit diagram of the DC motor and EMI filter shown in FIG. 3.

The EMI suppression circuit 34 is provided to suppress high-frequency EMI. This is preferably achieved by the provision of a plurality of capacitors 40, preferably Y-capacitors, and a plurality of shunt resistors 42 which are electrically connected to the first and second DC motor terminals 20a, 20b. This can be seen in the electrical circuit diagram of FIG. 4.

However, in addition to the high-frequency EMI suppression, there is also provided a pair of MW-band power chokes 44, respectively connected to the first and second motor terminals 20a, 20b, preferably distal to the EMI suppression circuit 34. These MW-band power chokes 44 are designed to suppress EMI in the MW frequency band.

The MW-band power chokes 44 are provided as ferrite-core coils, having a coil winding 46 wrapped around a ferrite rod 48. The ferrite rod 48 could be formed from a NiZn ferrite rod, but a MnZn ferrite rod may have superior properties for a given size of ferrite rod, thereby reducing the size of the MW-band power chokes 44 for a given inductance. Each MW-band power chokes 44 is electrically connected at a first end of the coil winding 46 to the corresponding first and second motor terminal 20a, 20b, with a second end of the coil winding 46 having a free electrical contact 50 for onward electrical connection to further components, and this could be provided as an insertable electrically conductive pin, for ease.

In order to provide suitable MW-band EMI suppression, it is preferred to use 53 µH inductors for the MW-band power chokes 44; however, it will be appreciated that suitable MW-band EMI suppression could be achieved with an inductor having an inductance, as measured at 500 Hz, anywhere in the region of around 25 to 125 µH, though more preferably in a range of 50 to 100 µH, measured a 1 kHz 1V. This assumes a coil winding 46 formed from copper wire having a diameter in a range of 0.3 to 0.55 mm. It will be appreciated that the minimum inductance may be of greater importance than the maximum inductance, since larger inductance power chokes 44 may also be suitable. As such, it is preferred that the inductance be at least 25 µH, and more preferably at least 50 µH.

It is noted that the absolute inductance will be dependent upon the measurement frequency and the diameter of the wire used in the coil, and the skilled person will therefore appreciate that the inductance may be tuned based on the circumstances of the suppression required.

By way of example only, a 0.55 mm diameter copper coil as used in the present embodiment may have a DC resistance of 98 mΩ, 80 turns, and an outer diameter of 7.6 mm once coiled. This will result in a measurable inductance of 53 µH at 500 Hz, and a measurable inductance of 69 µH at 1 kHz.

A 0.45 mm diameter copper coil, by contrast, may have a DC resistance of 117 mΩ, 80 turns, and an outer diameter of 5.9 mm once coiled. This will result in a measurable inductance of 53 µH at 500 Hz, but a measurable inductance of 63 µH at 1 kHz.

A 0.30 mm diameter copper coil may have a DC resistance of 217 mΩ, 85 turns, and an outer diameter of 4.4 mm once coiled. This will result in a measurable inductance of 53 µH at 500 Hz, but a measurable inductance of 57 µH at 1 kHz.

In each of these examples, a 15.6 mm long, 3 mm diameter ferrite rod 48 is used, which is formed from 70% $Fe_2O_3$, 15% Zinc Oxide, 10% Nickel Oxide, and 5% Copper Oxide.

Each of these inductors would be suitable for providing MW-band EMI suppression, and indicates how the skilled person might consider tuning their inductor to suit their specific needs. The inductance required will be dependent on the specification of the DC motor 10.

In order to suppress MW-band EMI to meet predetermined MW-frequency-band emission criteria, in particular CISPR 25, class 5 criteria in the MW frequency band, it is preferred that the MW-band power chokes 44 be tunable.

This would allow a user to suppress the MW-band EMI into an acceptable range by attaching an EMI suppression circuit 34 having first and second DC-motor-terminal inputs 36a, 36b to the first and second motor terminals 20a, 20b of the DC motor 10, coupling one or more MW-band power chokes 44 to one of the first and second DC-motor-terminal inputs 36a, 36b of the EMI suppression circuit 34, and then tuning an inductance of the MW-band power choke or chokes 44 until a predetermined MW-frequency-band emission criteria of the DC motor 10 is met.

Figure 5:
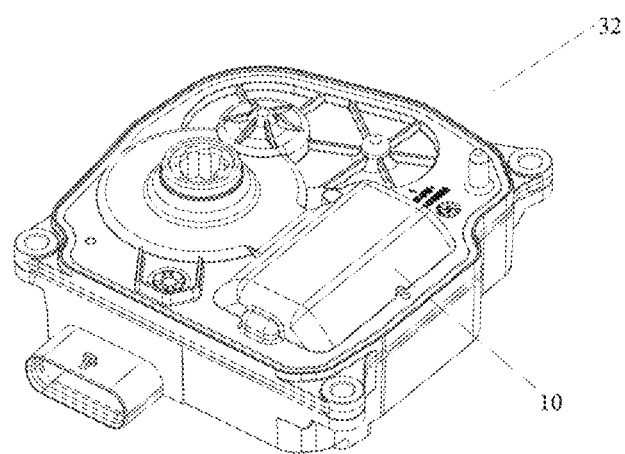
FIG. 5 shows a perspective representation of a valve actuator having the DC motor and EMI filter of FIG. 3, in accordance with the third aspect of the invention.

A suitable use of the present invention is indicated in FIG. 5, in the form of a valve actuator 52 for use in particular in automotive contexts. Transient current control is required in such arrangements, whilst still meeting the CISPR 25, class 5 criteria in the MW frequency band, and therefore the input capacitance must be limited, ideally to no more than a few hundred nF. This is achievable using the DC motor 10 and EMI filter 32 of the present invention.

Figure 6:
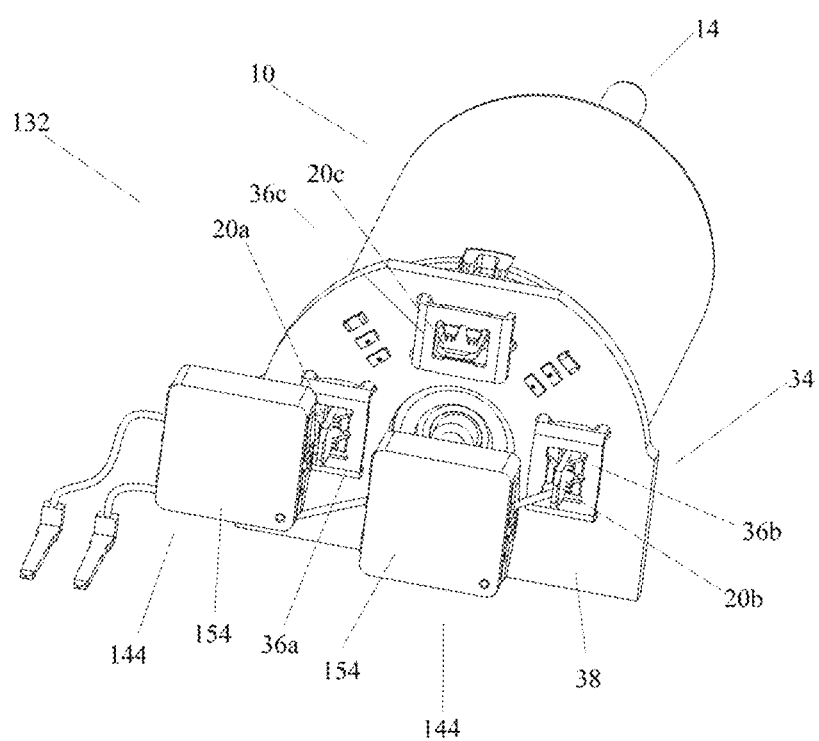
FIG. 6 shows a perspective representation of the DC motor of FIG. 1 having a second embodiment of an EMI filter in accordance with the first aspect of the invention.

A second embodiment of the invention is shown in FIG. 6. Identical or similar components to those in the first embodiment will be referenced using identical or similar reference numerals, and further detailed description will be omitted for brevity.

The DC motor 10 and EMI suppression circuit 34 of the EMI filter 132 remain unchanged from the first embodiment. However, instead of the ferrite-core coils of the first embodiment, the MW-band power chokes 144 could instead be provided as surface-mounted devices (SMDs) 154 which may have a casing or packaging which can be directly or indirectly mounted to the circuit substrate 38.

Such SMDs 154 comprise an appropriate inductor, again, preferably have an inductance in the range of 1 to 100 µH, which is encased in a PCB-mountable casing. In terms of functionality, it is anticipated that the SMDs 154 operate in the same manner as the ferrite-core coils, and therefore serve to reduce EMI in the MW frequency band.

Figure 7:
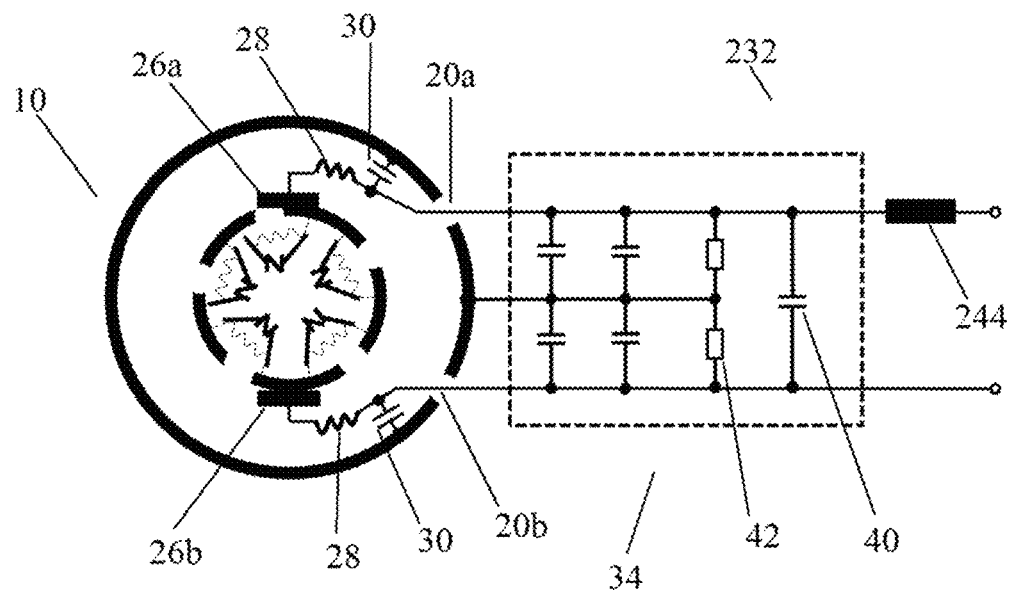
FIG. 7 shows an indicative circuit diagram of the DC motor of FIG. 1 coupled to a third embodiment of EMI filter in accordance with the first aspect of the invention.
Figure 8:
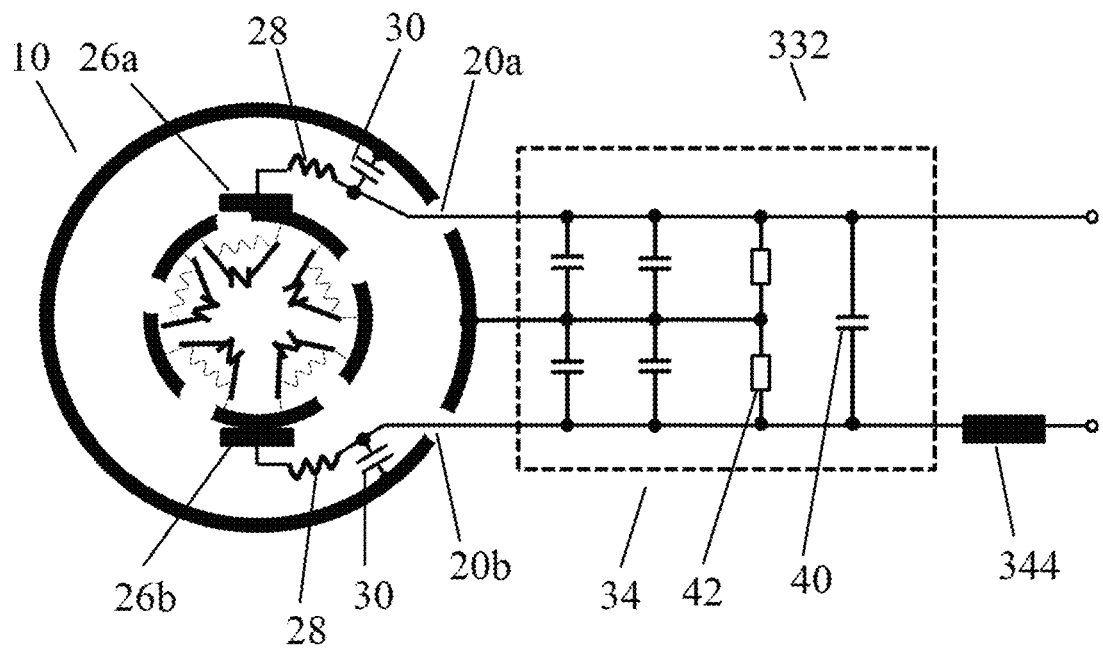
FIG. 8 shows an indicative circuit diagram of the DC motor of FIG. 1 coupled to a fourth embodiment of EMI filter in accordance with the first aspect of the invention.

Third and fourth embodiments of the invention are illustrated in the circuit diagrams of FIGS. 7 and 8. Again, identical or similar components to those in the first and second embodiments will be referenced using identical or similar reference numerals, and further detailed description will be omitted for brevity.

In each instance, only one MW-band power choke 244; 344 is provided. The arrangement of FIG. 7 illustrates an MW-band power choke 244 which is electrically coupled to the first motor terminal 20a, and therefore with the first DC-motor-terminal input 36a of the EMI filter 232 and EMI suppression circuit 34. The arrangement of FIG. 8 illustrates an MW-band power choke 344 which is electrically coupled to the second motor terminal 20b, and therefore the second DC-motor-terminal input 36b of the EMI filter 332 and EMI suppression circuit 34.

In either embodiment, the MW-band power choke 244; 344 may be formed as a ferrite-core coil, an SMD, or an alternative appropriate inductor which may be apparent to the skilled person.

Such an arrangement may reduce the total manufacturing cost of the EMI filter 232; 332, though it may consequentially be more difficult to tune the EMI filter 232; 332 to achieve compliance with the predetermined MW-frequency-band emission criteria, preferably CISPR 25, class 5 criteria.

As will be apparent, it is possible to use only a single MW-band power choke in order to arrive at the present advantages of the invention. It will also be apparent that it may be possible to use a plurality of MW-band power chokes of different types, for example, using one ferrite-core coil and one SMD.

Whilst an indicative EMI suppression circuit has been outlined for the present invention, it will be apparent that alternative circuit configurations suitable for reducing high frequency EMI will also be possible, and therefore the particular structure of the EMI suppression circuit could be altered whilst remaining within the scope of the present invention.

It is therefore possible to provide an enhanced EMI filter for a DC motor which reduces the EMI in the MW frequency band, thereby meeting one or more predetermined emission criteria. This can be achieved without the need to provide a large input capacitance, which is important for applications in which transient current control is required.

The words 'comprises/comprising' and the words 'having/including' when used herein with reference to the present invention are used to specify the presence of stated features, integers, steps or components, but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of examples only, and various other modifications will be apparent to persons skilled in the field without departing from the scope of the invention as defined herein.

The invention claimed is:

1. A DC motor comprising: a first motor terminal, a second motor terminal and an electromagnetic interference (EMI) filter for a DC motor, the EMI filter comprising:
   an EMI suppression circuit having first and second DC-motor-terminal inputs; and
   first and second MW-band power chokes coupled to one of the first and second DC-motor-terminal inputs to increase the motor inductance in the MW frequency band;
   wherein the first and second DC-motor-terminal inputs are connected to the first and second motor terminals, and wherein the DC motor further includes a varistor connected to a commutator of the DC motor, each of the first and second terminals being in brushed communication with the commutator.

2. The DC motor as claimed in claim 1, wherein the firsts and second MW-band power chokes are provided, respectively coupled to the first and second DC-motor-terminal inputs.

3. The DC motor as claimed in claim 1, wherein the MW-band power choke is a tunable-inductance power choke.

4. The DC motor as claimed in claim 1, wherein the MW-band power choke comprises a ferrite-core coil.

5. The DC motor as claimed in claim 4, wherein the ferrite-core coil comprises a coil winding around a MnZn ferrite rod.

6. The DC motor as claimed in claim 1, wherein the MW-band power choke comprises a surface-mounted device (SMD) power choke.

7. The DC motor as claimed in claim 1, wherein the MW-band power choke has an inductance of at least 25 μH.

8. The DC motor as claimed in claim 7, wherein the MW-band power choke has an inductance in the range of 25 to 125 μH.

9. The DC motor as claimed in claim 1, wherein the MW-band power choke has an inductance of at least 50 μH.

10. The DC motor as claimed in claim 1, wherein the EMI suppression circuit comprises a plurality of Y-capacitors and a plurality of shunt resistors.

11. The DC motor as claimed in claim 1, further comprising a first motor power choke coupled between the first DC-motor-terminal input and the first motor terminal, and a second motor power choke coupled between the second DC-motor-terminal and the second motor terminal.

12. A valve actuator comprising a DC motor as claimed in claim 1.

13. A method of suppressing MW-frequency-band emission of a DC motor, the method comprising the steps of:
 a] attaching an EMI suppression circuit having first and second DC-motor-terminal inputs to first and second motor terminals of the DC motor;
 b] coupling an MW-band power choke to one of the first and second DC-motor-terminal inputs of the EMI suppression circuit; and
 c] tuning an inductance of the MW-band power choke until a predetermined MW-frequency-band emission criterion of the DC motor is met; and the predetermined MW-frequency-band emission criterion is a CISPR 25, class 5 criterion in the MW frequency band.

* * * * *